(12) United States Patent
Tsorng et al.

(10) Patent No.: US 11,310,942 B1
(45) Date of Patent: Apr. 19, 2022

(54) MODULAR AIR-DUCT ASSEMBLY FOR A SERVER

(71) Applicant: Quanta Computer Inc., Taoyuan (TW)

(72) Inventors: Yaw-Tzorng Tsorng, Taoyuan (TW); Tung-Hsien Wu, Taoyuan (TW); Shin-Ming Su, Taoyuan (TW); Hsiang-Pu Ni, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/949,758

(22) Filed: Nov. 13, 2020

(51) Int. Cl.
*H05K 7/20* (2006.01)

(52) U.S. Cl.
CPC ..... *H05K 7/20727* (2013.01); *H05K 7/20145* (2013.01)

(58) Field of Classification Search
CPC ........... H05K 7/20718–20727; H05K 7/20145
See application file for complete search history.

(56) References Cited

U.S. PATENT DOCUMENTS

| | | | | |
|---|---|---|---|---|
| 6,478,284 B2 * | 11/2002 | Qiu | ....................... | F04D 29/601 248/680 |
| 6,643,131 B1 * | 11/2003 | Huang | .................. | H01L 23/467 165/121 |
| 7,643,292 B1 * | 1/2010 | Chen | ........................ | G06F 1/20 361/695 |
| 7,796,385 B2 * | 9/2010 | Yao | ..................... | F04D 25/0613 361/695 |
| 2002/0039282 A1 | 4/2002 | Han et al. | | |
| 2008/0068789 A1 | 3/2008 | Pav et al. | | |
| 2008/0232066 A1 | 9/2008 | Wu et al. | | |
| 2011/0014861 A1 * | 1/2011 | Tsai | ....................... | H01L 23/467 454/184 |
| 2011/0052133 A1 | 3/2011 | Simmons et al. | | |
| 2012/0020013 A1 | 1/2012 | Li | | |
| 2013/0212846 A1 * | 8/2013 | Koenig | ................ | A44B 11/263 24/616 |
| 2013/0286584 A1 | 10/2013 | Lin | | |
| 2014/0146471 A1 * | 5/2014 | Liu | ..................... | H05K 7/20727 361/695 |
| 2021/0076532 A1 | 3/2021 | Sung et al. | | |

OTHER PUBLICATIONS

Office Action in U.S. Appl. No. 16/949,779 dated Nov. 23, 2021, 14 pp.

* cited by examiner

*Primary Examiner* — Zachary Pape
(74) *Attorney, Agent, or Firm* — Nixon Peabody LLP (57) ABSTRACT

An air-duct assembly for a server comprises a main portion and an extension piece. The main portion has a first end region for receiving air from a fan and a second end region with a first attachment feature. The extension piece has a second attachment feature for mating with the first attachment feature. The extension piece guides the air from the second end region of the main portion to a terminal end of the extension piece. The air-duct assembly can be used with a first heat exchanger in a first configuration in which the extension piece is mated to the main portion, and the first heat exchanger is located within the extension piece. The air-duct assembly can also be used with a second heat exchanger in a second configuration in which only the main portion is used by itself and the second heat exchanger is located within the main portion.

19 Claims, 6 Drawing Sheets

MODULAR AIR-DUCT ASSEMBLY FOR A SERVER

FIELD OF THE INVENTION

The present invention relates generally to an air duct assembly for delivering and guiding cooling air within a server.

BACKGROUND OF THE INVENTION

Server products contain various types of electronic equipment that are mounted in a server chassis. The server often includes numerous processors and memory devices. As the function of these electronics increases, the power consumption increases, leading to the generation of higher levels of waste heat. Because the physical space within server chassis is confined, there is a limited volume for fans and air ducts to remove the heat from the electronic equipment.

Different server products often have the same style of server chassis so that they can fit into the same type of rack. Because the server products contain different electronics that are arranged in various configurations in the sever chassis, they often require heat exchangers having different sizes and shapes. Thus, the server products commonly utilize custom-sized air ducts that are mounted within the server chassis. Because they are made of plastic, there are different molds to create the different air ducts that match the heat exchanger's size and shape, which can lead to additional expenses. A need exists for a more modular air duct system that can be used with different heat exchangers and in different server products.

The present disclosure is directed to an improved air-duct assembly for a server that can be used in a variety of configurations to accommodate different heat exchangers and efficiently guide the air within the chassis.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, an air-duct assembly for a server comprises a main portion and an extension piece. The main portion has a first end region for receiving air from at least one fan and a second end region. The main portion has a first attachment feature at the second end region. The extension piece has a second attachment feature for mating with the first attachment feature of the main portion. The extension piece guides the air from the second end region of the main portion to a terminal end of the extension piece. The air-duct assembly can be used in conjunction with a first heat exchanger in a first configuration in which the extension piece is mated to the main portion and the first heat exchanger is located within the extension piece. The air-duct assembly can also be used in conjunction with a second heat exchanger in a second configuration in which only the main portion is used by itself and the second heat exchanger is located within the second end region of the main portion.

According to a configuration of the above implementation, the first attachment feature includes a slot located between guide structures, and the second attachment feature includes an arm that slides within the slot.

According to another configuration of the above implementation, the arm includes a hook structure that creates a snap-fit attachment on a surface of the main portion adjacent to the slot.

According to a further configuration of the above implementation, the arm has a width that is slightly less than a width of the slot so as to restrict lateral movement of the extension piece relative to the main portion.

In a further aspect of the above implementation, the first attachment feature further includes a rib structure, and the second attachment feature further includes a notch for mating with the rib structure.

In yet a further aspect of the above implementation, the main portion includes a projecting tab and support surfaces adjacent to the tab. The support surfaces engage an underlying surface of the extension piece.

In another aspect of the above implementation, the extension piece includes an opening for receiving the tab. The underlying surface of the extension piece that engages the support surfaces is adjacent to the opening.

According to a further configuration of the above implementation, the main portion and the extension piece define a cable-routing channel for receiving a cable in the first configuration.

According to another configuration of the above implementation, the first and second attachment features create a snap-fit attachment between the main portion and the extension piece.

In yet a further aspect of the above implementation, the air-duct assembly further includes a second extension piece that has a third attachment feature for mating with the first attachment feature of the main portion. The second extension piece guides the air from the second end region of the main portion to a terminal end of the second extension piece. The air-duct assembly can be used in conjunction with a third heat exchanger in a third configuration in which the second extension piece is mated to the main portion, and the third heat exchanger is located within the second extension piece.

In another aspect of the present disclosure, a kit of components for constructing an air-duct assembly for a server comprises a main portion, first extension piece, and a second extension piece. The main portion has a first end region and a second end region. The main portion receives air from a fan within the server at the first end region and guides the air toward the second end region. The first extension piece is attachable to the second end region of the main portion. The first extension piece guides the air from the second end region of the main portion to a terminal end of the first extension piece. The first extension piece has a first size that accommodates a first heat exchanger to be placed within the server. The second extension piece is attachable to the second end region of the main portion. The second extension piece guides the air from the second end region of the main portion to a terminal end of the second extension piece. The second extension piece has a second size that accommodates a second heat exchanger to be placed within the server. The second size is different from the first size.

According to another aspect of the above implementation, the second end region of the main portion includes a snap-fit connection permitting attachment to the first extension piece or the second extension piece.

According to a further aspect of the above implementation, the second end region of the main portion includes a slot located between guide structures. Each of the first and second extension pieces including an arm that is capable of sliding within the slot.

According to yet a further aspect of the above implementation, each of the arms of the first and the second extension pieces includes a hook structure that creates the snap-fit connection on a surface of the main portion adjacent to the slot.

According to another configuration of the above implementation, the main portion includes two air-exit sections at the second end region, the first extension piece being attachable to the main portion adjacent to a first one the two air-exit sections. The second extension piece being attachable to the main portion adjacent to a second one the two air-exit sections.

According to another configuration of the above implementation, the main portion includes a projecting tab and support surfaces adjacent to the tab. The support surfaces engage an underlying surface of the first extension piece or the second extension piece.

In a further aspect of the present disclosure, a server comprises a chassis, first electronic component, at least one fan, and an air-duct assembly. The chassis has a base and side walls extending upwardly from the base. The first electronic component within the chassis is in thermal communication with a heat exchanger for removing heat from the first electronic component. The fan within the chassis moves air within the chassis. The air-duct assembly within the chassis defines an air passage that guides the air from the fan to move across the heat exchanger. The air-duct assembly comprises a main portion and a first extension piece. The first extension piece is located over the heat exchanger and is detachably attached to the main portion. In response to the first extension piece being detached from the main portion, a second extension piece can be detachably attached to the main portion of the air-duct assembly.

According to a further aspect of the above implementation, the first extension piece is detachably attached to the main portion by a snap-fit connection.

According to yet a further aspect of the above implementation, the chassis includes a plurality of latches, and the main portion of the air-duct assembly includes a plurality of slots that mate with the plurality of latches for mounting the air-duct assembly to the chassis.

According to another aspect of the above implementation, the second extension piece is a different size than the first extension piece.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." More-over, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 1:
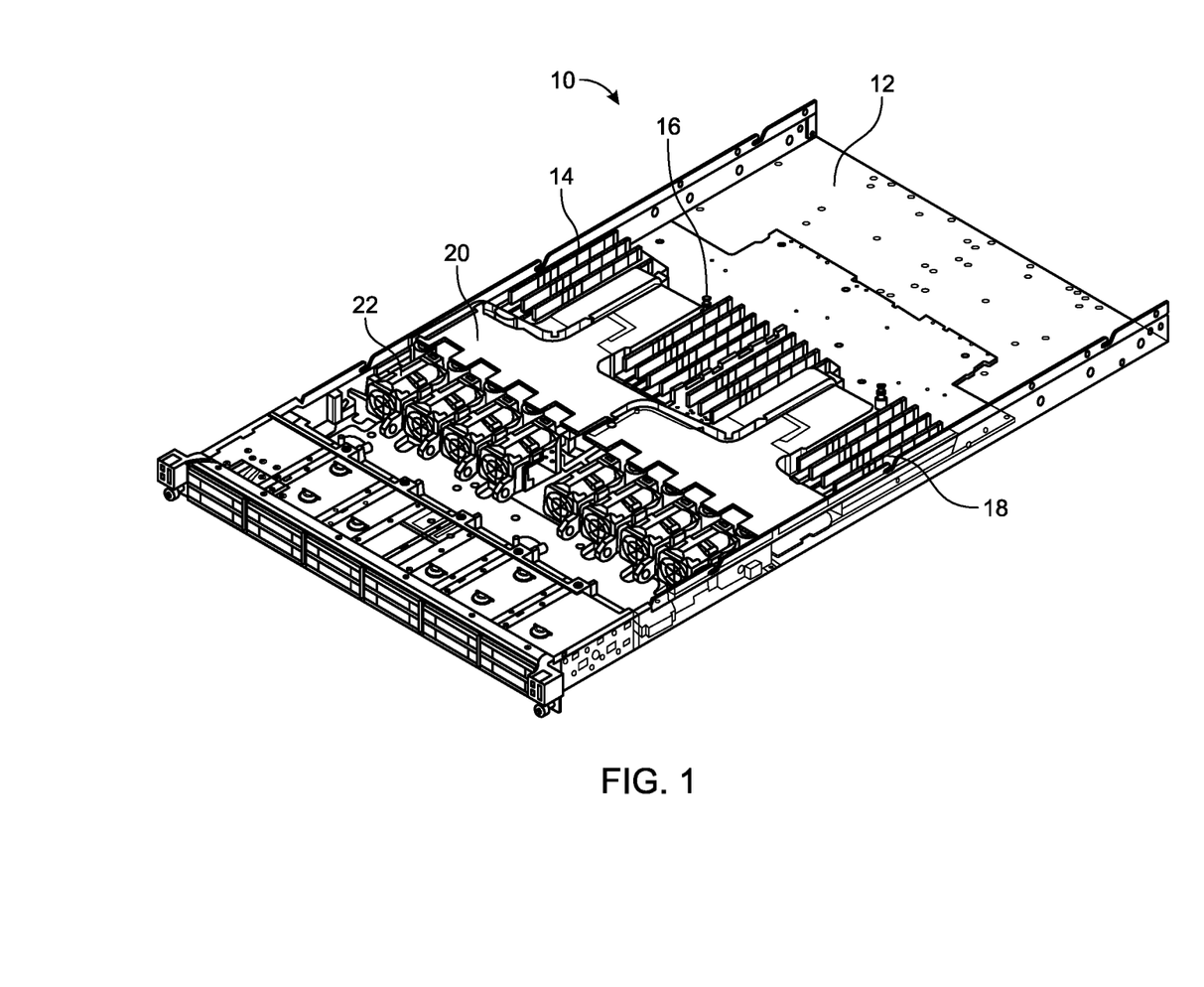
FIG. 1 is a perspective view of a server with an air-duct assembly, in accordance with one embodiment of the present disclosure.

FIG. 1 illustrates a perspective view of a server 10 having a chassis 12 that contains printed circuit boards (PCBs) and electronics at different locations within the chassis 12. In the embodiment of FIG. 1, electronics modules 14, 16, 18 are located in the middle region of the chassis 12 and include various electronic components that create heat, such as memory storage devices and processors. In one embodiment, one or more of the electronics modules 14, 16, 18 may include a series of dual in-line memory modules (DIMM).

When considering the various electronics within the server 10, some components (e.g., processors) produce more waste and are more sensitive to temperature than other components, thereby requiring specific attention to maintain them at suitable operating temperatures. To do so, the server 10 includes an air-duct assembly 20 that guides air from a pair of fan modules 22 across heat exchangers, which are located under the air-duct assembly 20. The heat exchangers are in direct contact with the temperature-sensitive components, such that waste heat is transferred into the heat exchangers via thermal conduction. The waste heat is then removed from the heat exchangers via thermal convection into the moving air.

As shown, each fan module 22 includes four different fans that draw air into the server 10 via vents at the front of the chassis 12. Although FIG. 1 illustrates two fan modules 22 with four fans in each fan module 22, it should be understood that the specific number fans within each fan module 22 may be different and the number of fan modules 22 may be different.

Figure 2:
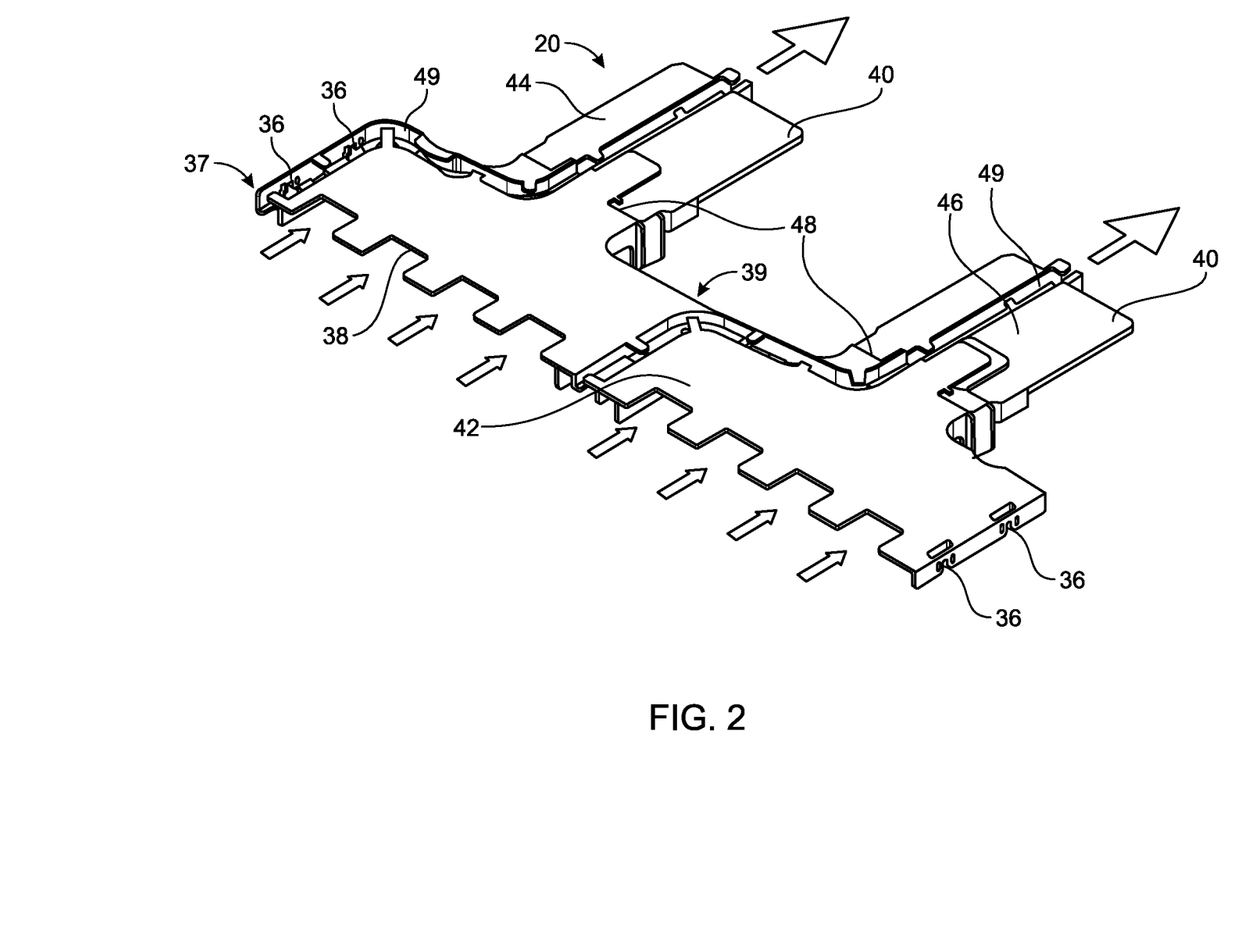
FIG. 2 is perspective view of only the air-duct assembly in FIG. 1.

FIG. 2 illustrates a perspective view of only the air-duct assembly 20. In the illustrated embodiment of FIG. 2, four mounting regions 36 include slots along the side of the air-duct assembly 20 that mate with latches on the inside walls of the server chassis 12 (FIG. 1) to create a snap-fit attachment mechanism. In other embodiments, the number of mounting regions 36, the locations of the mounting regions 36, and the types of mechanisms within the mounting regions 36 may be different.

The flow of the air from the eight fans in the two fan modules 22 (FIG. 1) is depicted by the eight smaller arrows in FIG. 2. The air moves into a first end region 37, which includes a plurality of openings 38. Each opening 38 corresponds to a single fan such that an upper surface of the fan fits within its respective opening 38. Each of the openings 38 allows the respective fan to be removed and replaced (or repaired) without the need for removing the entire air-duct assembly 20 from the server 10 (FIG. 1).

As shown in FIG. 2, the air-duct assembly 20 is comprised of a main portion 42 and two extension pieces 44, 46. The fans cause air to be forced away from the first end region 37 of the main portion 42, and toward a second end region 39 of the main portion 42. The air then moves from the second end region 39 into the two extension pieces 44, 46. The two extension pieces 44, 46 define a pair of physically separated outlets 40 that are adjacent to and cover the heat exchangers associated with the heated components. As shown by the two large arrows in FIG. 2, the forced air from four fans exits from one outlet 40, while the forced air from the other four fans exits from the other outlet 40 of the air-duct assembly 20. After leaving the terminal ends of the two extension pieces 44, 46 at the pair of outlets 40, the air continues traveling within the server and provides cooling to other electronics, before exiting from vents on the back side of the server chassis 12 (FIG. 1).

The two extension pieces 44, 46 of the air-duct assembly 20 are attached to the main portion 42 via mechanical connections (described below in more detail FIG. 3-5) and form a pair of seams 48. The air-duct assembly 20 also includes cable-routing channels 49 that receive cables and/or wires connecting the electronic components in front of and behind the air-duct assembly 20. The cable-routing channels 49 extend within the main portion 42 and the extension pieces 44, 46. Cables and/or wires may be retained within the cable-routing channels 49 by clamping structures located in the upper walls of the air-duct assembly 20 along the cable-routing channels 43. It should be understood that the present invention is useful with the air-duct assembly 20 that includes the cable-routing channels 49 as shown in the illustrated embodiments, and also with air-duct assemblies that lack cable-routing channels.

Figure 3:
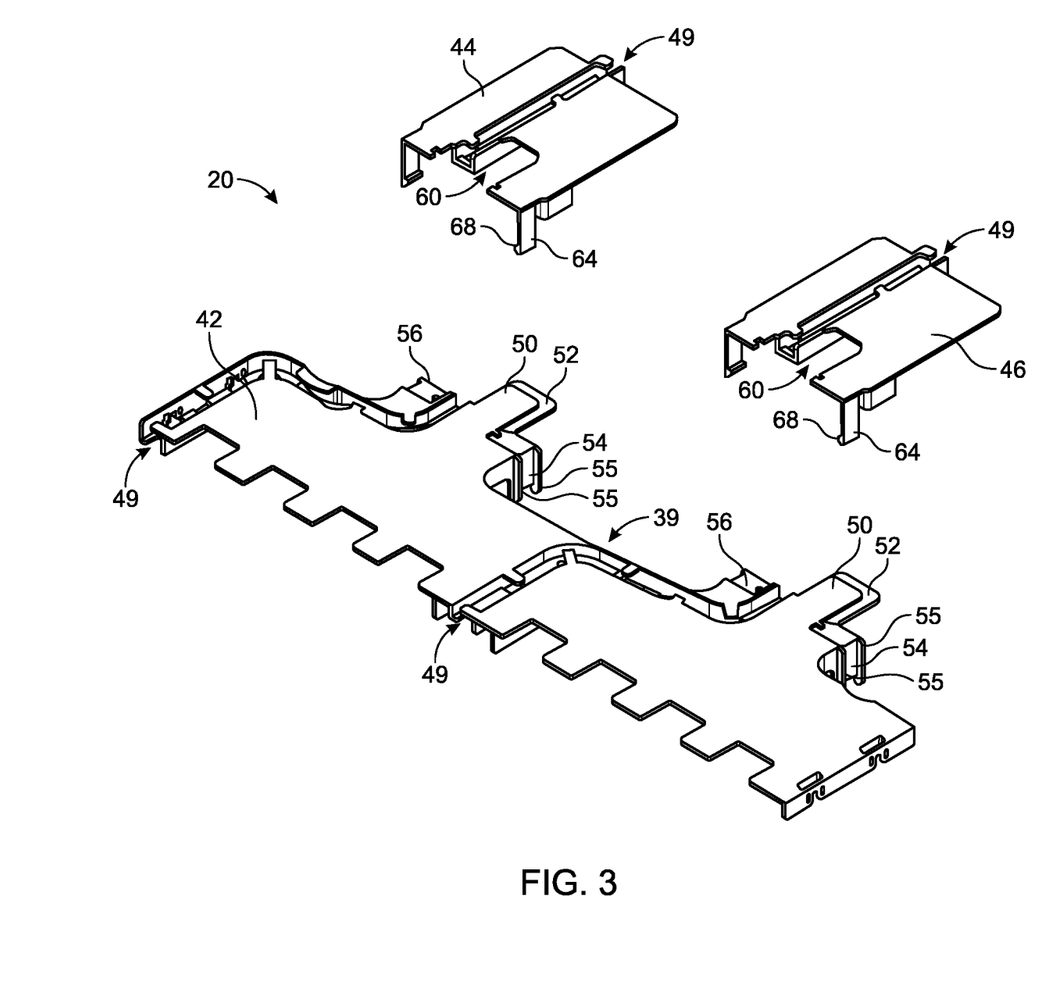
FIG. 3 is perspective view of the air-duct assembly in FIG. 1 with the extension pieces disassembled.

FIG. 3 illustrates the air-duct assembly 20 with the two extension pieces 44, 46 disassembled from the main portion 42. As shown, the main portion 42 is assembled to two extension pieces 44, 46 that are identical in shape and size. But the present invention also contemplates the main portion 42 being assembled to two different extension pieces that have different sizes and shapes so as to be used with various heat exchanger arrangements within the server chassis 12 (FIG. 1).

For mating with each of the two extension pieces 44, 46, the main portion 42 includes a projecting tab 50 that includes a support surface 52. Along its side surfaces, the main portion 42 also includes a slot 54 that is defined by a pair of guide structures 54. A secondary support surface 56 is separated from the projecting tab 50 by the cable-routing channel 49. Because the main portion 42 attaches to the two extension pieces 44, 46, the main portion 42 of the air-duct assembly 20 has two sets of projecting tabs 50, support surfaces 52, slots 54, guide structures 55, and secondary support surfaces 56, as shown in the illustrated embodiment of FIG. 3.

The two extension pieces 44, 46 have corresponding structures to mate with the projecting tabs 50, support surfaces 52, slots 54, guide structures 55, and secondary support surfaces 56 on the main portion 42. Each extension piece 44, 46 includes an opening 60 that mates with the corresponding projecting tab 50. Each extension piece 44, 46 also includes an arm 64 that terminates in a hook structure 64 that latches to the underside surface of the main portion 42 in a snap-fit connection, as described below relative to FIGS. 4-5.

Figure 4:
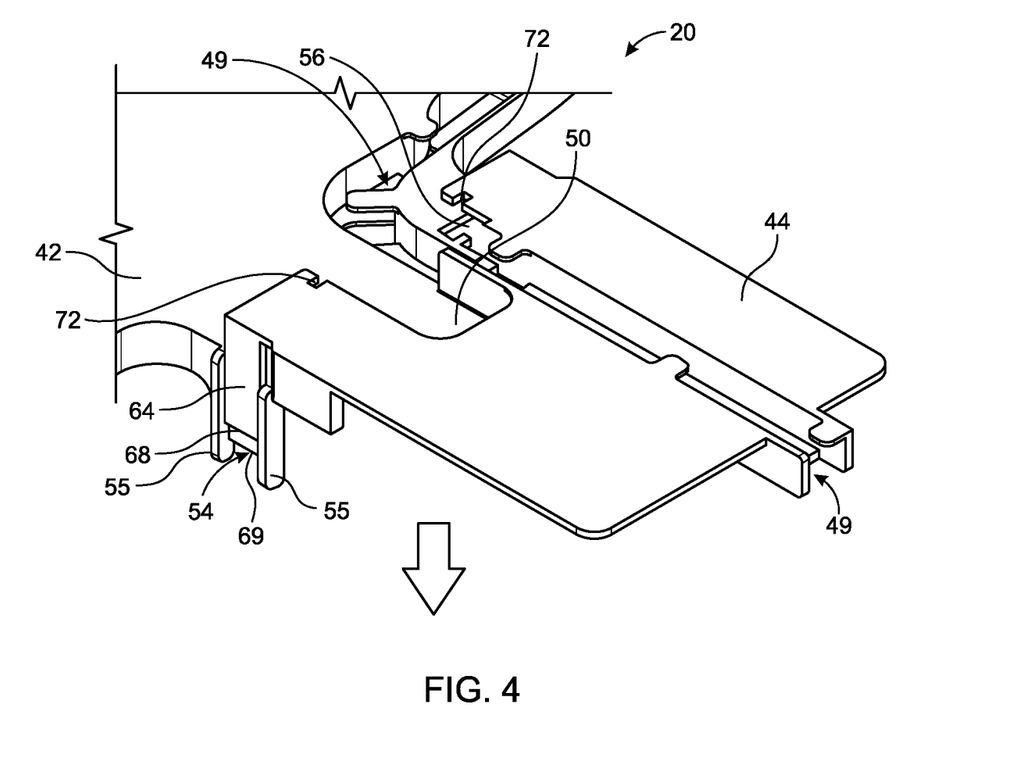
FIG. 4 illustrates one of the extension pieces being assembled to the main portion of the air-duct assembly.
Figure 5:
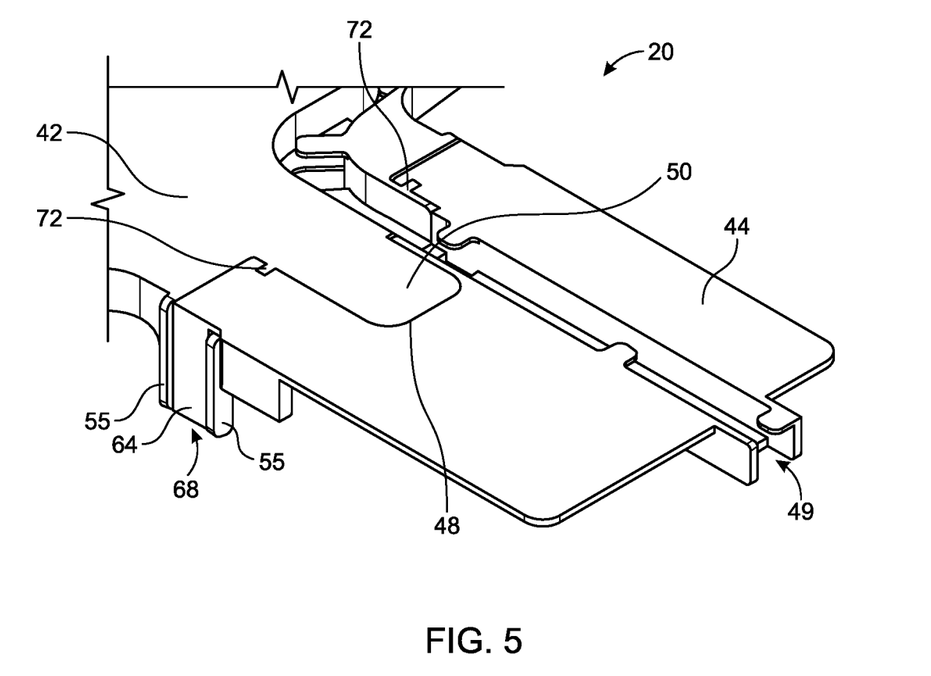
FIG. 5 illustrates the extension piece in FIG. 4 in a final assembled state on the main portion of the air-duct assembly.

FIGS. 4 and 5 illustrate the process of attaching extension piece 44 to the main portion 42 of the air-duct assembly 20. FIG. 4 illustrates the downward movement of the extension piece 44 onto the main portion 42, while FIG. 5 illustrates the final assembly state. The arms 64 on the extension piece 44 slide within the slot 54 between the two guide structures 55, until the hook structure 68 at the bottom of the arm 64 moves past a lowermost surface 69 (FIG. 4) within the slot 54. The hook structure 68 then snaps into place to vertically lock the extension piece 44 onto the main portion 42. Due to the arms 64 on the extension piece 44 having a size that is slightly less than the width of the slots 54, the extension piece 44 and the main portion 42 are also horizontally locked in place (i.e., in the direction of the cable-routing channel 49 of the extension piece 44 in FIG. 4). The support surfaces 52 (shown in FIG. 3) near the tab 50 also engage underside surfaces of the extension piece 44 for vertical support.

Similarly, the secondary support surface 56, shown in FIG. 4, engages another underside surface of the extension piece 44 for vertical support. For vertical support of the overall air-duct assembly 20, the underside surfaces of the main portion 42 and the extension piece 44 may include support bosses that extend downwardly to engage underlying components (e.g., a heat exchanger) or support structures of the server chassis 12 (FIG. 1).

To disassemble the air-duct assembly 20, the hook structures 68 can be manually opened on both sides of the extension piece 44, such that the extension piece 44 can be vertically pulled away from the main portion 42. In some embodiments, access to the underlying heat exchanger and components is achieved without removing the entire main portion 42. If the underlying electronic component needs to be replaced by a newer version of the same component, then the same extension piece 44 can be reassembled onto the main portion 42. If the underlying electronic component needs to be replaced by a different component, then the same extension piece 44 (assuming it fits the different component) or a different style extension piece can be reassembled onto the main portion 42. As discussed relative to FIG. 6 below, it is also possible for the air-duct assembly 20 to be used without an extension piece whatsoever.

FIGS. 4 and 5 also illustrate a notch structure 72 in the extension piece 44 that mates with a correspondingly shaped rib in the main portion 42. In addition to helping to properly register the extension piece 44 with the main portion 42 during assembly, the notch structure 72 assists in locking the main portion 42 to the extension piece 44 in the final assembly state in FIG. 5.

Figure 6:
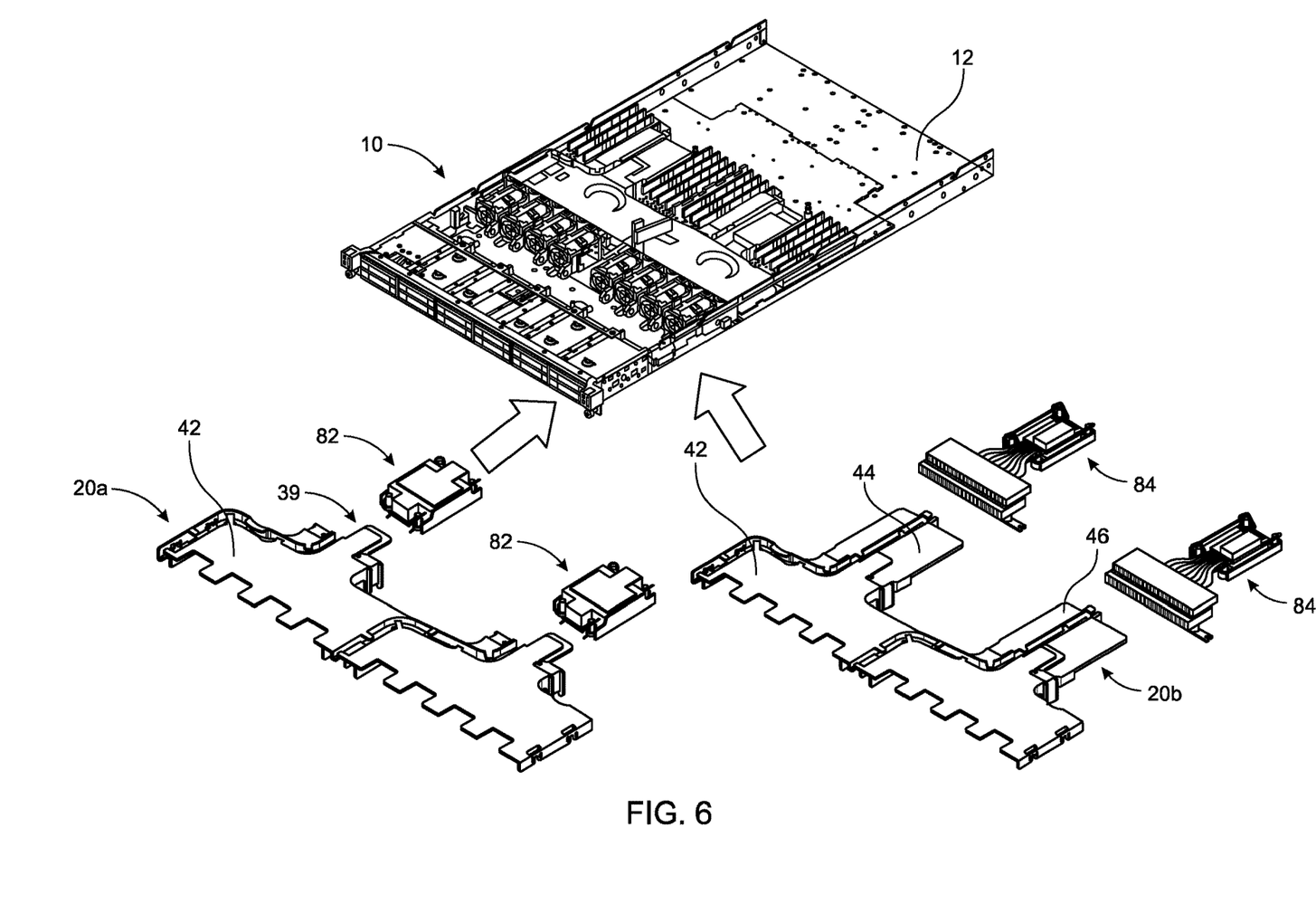
FIG. 6 is a schematic illustration of two exemplary configurations of the air-duct assembly, in accordance with one embodiment of the present disclosure.

FIG. 6 schematically illustrates one of the advantages of the air-duct assembly 20 described in FIGS. 1-5. In particular, the air-duct assembly 20 provides modularity because it can be used with multiple sizes of heat exchangers in the same server 12 (or in different servers). In one configuration, as shown on the left of FIG. 6, two smaller heat exchangers 82 are used to remove heat from two similar heated components. In this scenario, an air-duct assembly 20a utilizes only the main portion 42 (i.e., no extension pieces 44, 46 are needed) to guide air through the heat exchangers 82, which fit under the second end region 39 of the main portion 42. On the other hand, as shown on the right of FIG. 6, when larger heat exchangers 84 are needed to cool the electronic components, an air duct assembly 20b utilizing the main portion 42 and the two extension pieces 44, 46 is necessary to guide the air across the heat exchangers 84. The heat exchangers 84 fit under the two extension pieces 44, 46. Regardless of the configuration to be used within the server 10, the air-duct assemblies 20a and 20b connect to the server chassis 12 in the same way.

In addition to the benefit of being useful with different heat exchangers, the air-duct assembly 20 provides for a more efficient manufacturing process because the same mold can be used for the larger main portion 42, such that mold-processing costs are less. The extension pieces 44, 46 are smaller and, thus, have lower mold-processing costs. The main portion 42 can be used with a variety of components and heat exchangers and in different server products. The variations in sizes and shapes is provided by different sizes and shapes of the extension pieces. Thus, a large number of air-duct assemblies 20 will use the same main portion 42, but each air-duct assembly 20 may use different extension pieces (or no extension pieces) to accommodate the different electronic components and heat exchangers.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An air-duct assembly for a server, comprising:
a main portion having a first end region for receiving air from at least one fan and a second end region, the main portion having a first attachment feature at the second end region, the second end region including a projecting tab that projects away from the main portion in a direction of airflow; and
an extension piece having a second attachment feature for mating with the first attachment feature of the main portion, the extension piece including an opening for receiving the projecting tab, the extension piece guiding the air from the second end region of the main portion to a terminal end of the extension piece; and
wherein the air-duct assembly can be used in conjunction with a first heat exchanger in a first configuration in which the extension piece is mated to the main portion and the first heat exchanger is located within the extension piece, and wherein the air-duct assembly can be used in conjunction with a second heat exchanger in a second configuration in which only the main portion is used by itself, and the second heat exchanger is located within the second end region of the main portion, the second heat exchanger being under the projecting tab in the second configuration.

2. The air-duct assembly of claim 1, wherein the first attachment feature includes a slot located between guide structures, and the second attachment feature includes an arm that slides within the slot.

3. The air-duct assembly of claim 2, wherein the arm includes a hook structure that creates a snap-fit attachment on a surface of the main portion adjacent to the slot.

4. The air-duct assembly of claim 3, wherein the arm has a width that is less than a width of the slot so as to restrict lateral movement of the extension piece relative to the main portion.

5. The air-duct assembly of claim 2, wherein the first attachment feature further includes a rib structure, and the second attachment feature further includes a notch for mating with the rib structure.

6. The air-duct assembly of claim 1, wherein the main portion includes support surfaces adjacent to the projecting tab, the support surfaces for engaging an underlying surface of the extension piece.

7. The air-duct assembly of claim 6, wherein the underlying surface of the extension piece is adjacent to the opening.

8. The air-duct assembly of claim 1, wherein, in the first configuration, the main portion and the extension piece define a cable-routing channel for receiving a cable.

9. The air-duct assembly of claim 1, wherein the first and second attachment features create a snap-fit attachment between the main portion and the extension piece.

10. The air-duct assembly of claim 1, further including a second extension piece that has a third attachment feature for mating with the first attachment feature of the main portion, the second extension piece guiding the air from the second end region of the main portion to a terminal end of the second extension piece, and wherein the air-duct assembly can be used in conjunction with a third heat exchanger in a third configuration in which the second extension piece is mated to the main portion, and the third heat exchanger is located within the second extension piece.

11. A kit of components for constructing an air-duct assembly for a server, comprising:
a main portion having a first end region and a second end region, the main portion receiving air from a fan within the server at the first end region and guiding the air toward the second end region;
a first extension piece that is attachable to the second end region of the main portion, the first extension piece guiding the air from the second end region of the main portion to a terminal end of the first extension piece, the first extension piece having a first size that accommodates a first heat exchanger to be placed within the server; and
a second extension piece that is attachable to the second end region of the main portion, the second extension piece guiding the air from the second end region of the main portion to a terminal end of the second extension piece, the second extension piece having a second size that accommodates a second heat exchanger to be placed within the server, the second size being different from the first size.

12. The kit of components for an air-duct assembly of claim 11, wherein the second end region of the main portion includes a snap-fit connection permitting attachment to the first extension piece or the second extension piece.

13. The kit of components for an air-duct assembly of claim 12, the second end region of the main portion includes a slot located between guide structures, each of the first and second extension pieces including an arm that is slidable within the slot.

14. The kit of components for an air-duct assembly of claim 13, wherein each of the arms of the first and the second extension pieces includes a hook structure that creates the snap-fit connection on a surface of the main portion adjacent to the slot.

15. The kit of components for an air-duct assembly of claim 11, wherein the main portion includes two air-exit sections at the second end region, the first extension piece being attachable to the main portion adjacent to a first one the two air-exit sections, the second extension piece being attachable to the main portion adjacent to a second one the two air-exit sections.

16. The kit of components for an air-duct assembly of claim 11, wherein the main portion includes a projecting tab and support surfaces adjacent to the tab, the support surfaces for engaging an underlying surface of the first extension piece or the second extension piece.

17. A server, comprising:
a chassis having a base and side walls extending upwardly from the base;
a first electronic component within the chassis that is in thermal communication with a heat exchanger for removing heat from the first electronic component;
at least one fan for moving air within the chassis; and
an air-duct assembly within the chassis that defines an air passage that guides the air from the fan to move across the heat exchanger, the air-duct assembly comprising a main portion and a first extension piece, the first extension piece being located over the heat exchanger, the main portion including a slot and the first extension piece including an arm that slides within the slot, the arm including a hook allowing the first extension piece to be detachably attached to the main portion via a snap-fit connection, the main portion includes a projecting tab that projects away from the main portion in a direction of airflow, the main portion includes support surfaces adjacent to the projecting tab, the first extension piece includes an opening for receiving the projecting tab, the support surfaces for engaging the first extension piece; and
wherein, in response to the first extension piece being detached from the main portion, a second extension piece is capable of being detachably attached to the main portion of the air-duct assembly.

18. The server of claim 17, wherein the chassis includes a plurality of latches and the main portion of the air-duct assembly includes a plurality of slots that mate with the plurality of latches for mounting the air-duct assembly to the chassis.

19. The server of claim 17, wherein the second extension piece is a different size than the first extension piece.

* * * * *